United States Patent
Megens et al.

(10) Patent No.: US 8,502,955 B2
(45) Date of Patent: Aug. 6, 2013

(54) METHOD OF DETERMINING A CHARACTERISTIC

(75) Inventors: Henricus Johannes Lambertus Megens, Waalre (NL); Johannes Anna Quaedackers, Veldhoven (NL); Christian Marinus Leewis, Maastricht (NL); Peter Clement Paul Vanoppen, Hechtel-Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 601 days.

(21) Appl. No.: 12/641,742

(22) Filed: Dec. 18, 2009

(65) Prior Publication Data

US 2010/0165312 A1    Jul. 1, 2010

Related U.S. Application Data

(60) Provisional application No. 61/141,414, filed on Dec. 30, 2008, provisional application No. 61/225,654, filed on Jul. 15, 2009.

(51) Int. Cl.
*G03B 27/42* (2006.01)

(52) U.S. Cl.
USPC .............................................. 355/53; 355/77

(58) Field of Classification Search
USPC ......... 355/53, 77; 356/364, 369, 401; 702/27; 430/5, 30, 311, 22, 312, 322, 323, 327, 394
See application file for complete search history.

(56) References Cited

U.S. PATENT DOCUMENTS

| | | | |
|---|---|---|---|
| 6,433,878 B1 * | 8/2002 | Niu et al. ....................... | 356/603 |
| 7,532,331 B2 | 5/2009 | Kiers et al. | |
| 7,619,737 B2 | 11/2009 | Mos et al. | |
| 7,704,850 B2 | 4/2010 | Dusa et al. | |
| 2003/0212525 A1 * | 11/2003 | Bischoff et al. ............... | 702/127 |
| 2007/0003878 A1 | 1/2007 | Paxton et al. | |
| 2008/0036984 A1 | 2/2008 | Mos et al. | |
| 2008/0311344 A1 | 12/2008 | Marie Kiers et al. | |

FOREIGN PATENT DOCUMENTS

| | | |
|---|---|---|
| CN | 101202268 A | 6/2008 |
| CN | 101231472 A | 7/2008 |
| CN | 101320206 A | 12/2008 |
| EP | 1 628 164 A | 2/2006 |
| JP | 2008-042200 A | 2/2008 |
| JP | 2008-102125 A | 5/2008 |
| JP | 2008-281825 A | 11/2008 |
| JP | 2008-311645 A | 12/2008 |

OTHER PUBLICATIONS

English-Language Abstract for Japanese Patent Publication No. 2008-281825 A, published Nov. 20, 2008; 1 page.
English-Language Abstract for Chinese Patent Publication No. 101320206 A, published Dec. 10, 2008; 1 page.

* cited by examiner

*Primary Examiner* — Steven H Whitesell Gordon
*Assistant Examiner* — Mesfin T Asfaw
(74) *Attorney, Agent, or Firm* — Sterne, Kessler, Goldstein & Fox P.L.L.C.

(57) ABSTRACT

A plurality of targets including a second population superimposed on a first population are formed. In the first target the second population has an asymmetry with respect to the first population. In the second target the second population has a different asymmetry with respect to the first population. Reflected radiation is detected from both the targets and used to determine different characteristics of the underlying populations.

12 Claims, 5 Drawing Sheets

METHOD OF DETERMINING A CHARACTERISTIC

CROSS REFERENCE TO RELATED APPLICATIONS

This application claims benefit under 35 U.S.C. §119(e) to U.S. Provisional Patent Applications 61/141,414, filed Dec. 30, 2008 and 61/225,654, filed Jul. 15, 2009, which are both incorporated by reference herein in their entireties.

BACKGROUND

1. Field of the Invention

The present invention relates to a method of determining a characteristic of a substrate.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The manufacture of IC chip involves the fabrication of many layers. In order to generate a more detailed pattern a plurality of lithography and etch processing steps may be used in the manufacture of each layer: this is known as double patterning. There are a number of different methods of achieving double patterning. The first of these is known as lithographic-etch-lithography-etch (LELE) and in this a first pattern is exposed and etched. A second pattern, with features located in the spaces between the features of the first pattern, is then exposed and etched. Thus, a pattern of smaller dimensions can be generated. Another similar double patterning technique is known as lithography-freeze-lithography-etch (LFLE). A pattern is exposed in the resist, which is then frozen. A second pattern can then also be exposed in the resist and both patterns are then etched into the substrate. Another double patterning method is known as the spacer method. In the spacer method a sacrificial template is put down and spacers placed either side, and adjacent to, the sacrificial template. The template is then removed and the resulting pattern etched into the substrate.

When two lithography steps are used to create a single pattern there may be some errors, for example in the placement of the features during the second lithography step. Similarly, the features exposed during the first lithography step may not be identical to those exposed during the second lithography step. As there have been two lithography steps the features exposed during each lithography step may be different and need to be assessed separately. However, as the features exposed during the first and second lithography step are, necessarily, very similar and form a regular pattern it can be difficult to distinguish between the two sets of features using angular resolve scatterometry.

In the spacer technique a spacer is used to generate a regular pattern. However, if the spacer is too large or too small the pattern will be irregular. Similarly, although the pattern may be almost irregular it will be difficult to assess small irregularities in the pattern.

Previously SEM has been used to assess the features exposed in each of the exposure steps. However, SEM is not fast enough to keep up with the throughput of substrate in high volume manufacturing of IC chips and can lack accuracy.

SUMMARY

It is desirable to provide an improved method of assessing the features used in double patterning techniques.

According to an embodiment of the present invention, there is provided an inspection apparatus, lithographic apparatus or lithographic cell configured to measure a property of a substrate, method of determining a characteristic of either a first population or a second population of features on a substrate, the first and second population being nominally identical and forming a single pattern within a single layer on a substrate, the pattern having a period equal to the distance between a feature of the first population and the nearest feature of the second population. The method comprise the follow steps. Forming a first population on the substrate, the first population comprising a first target population and a second target population, the second target population being distinct from the first target population. Forming a second population on the substrate, the second population comprising a third target population and a fourth target population, the fourth target population being distinct from the third target population, the third target population and the first target population forming a first combined target and the fourth target population and the second target populations forming a second combined target; detecting radiation reflected from the first combined target. Calculating a characteristic of either the first population or the second population using radiation reflected from the first combined target. Detecting radiation reflected from the second combined target; calculating a characteristic of either the first population or the second population using radiation reflected from the second combined target. The third target population has a first asymmetry with respect to the first target population and the fourth target population has a second asymmetry with respect to the second target population, the first and second asymmetries being different.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figures 8A, 8B, 8C, 9, 10A, 10B, 10C:
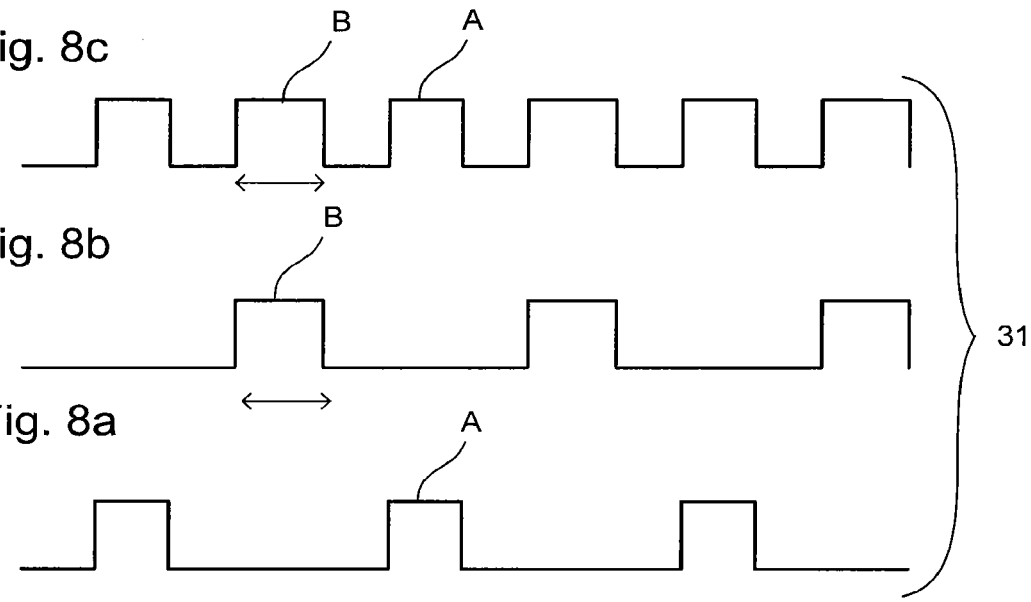

FIGS. 8a, 8b, and 8c depict a first target.

FIG. 9 depicts targets according to an embodiment of the invention.

FIGS. 10a, 10b, and 10c depict a second target.

Figure 11:

FIG. 11 depicts an alternative target.

Figure 12A:
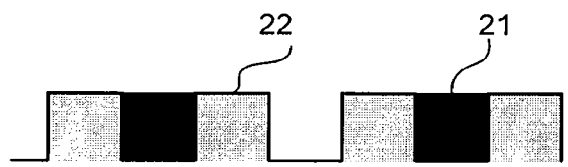
Figure 12B:
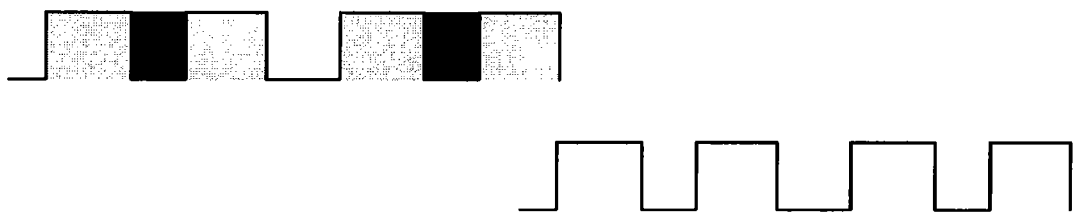

FIGS. 12a and 12b depict an alternative target.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
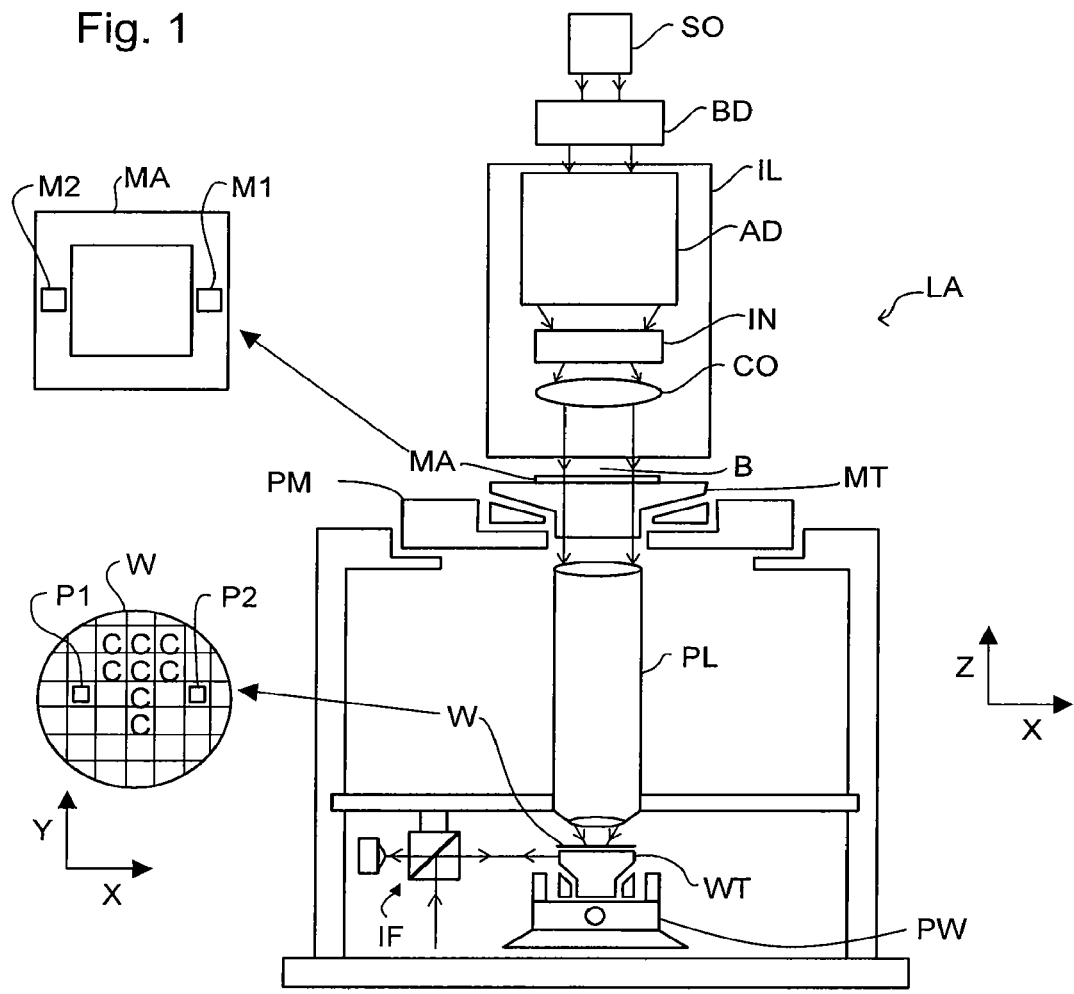
FIG. 1 depicts a lithographic apparatus.

FIG. 1 schematically depicts a lithographic apparatus. The apparatus comprises: an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
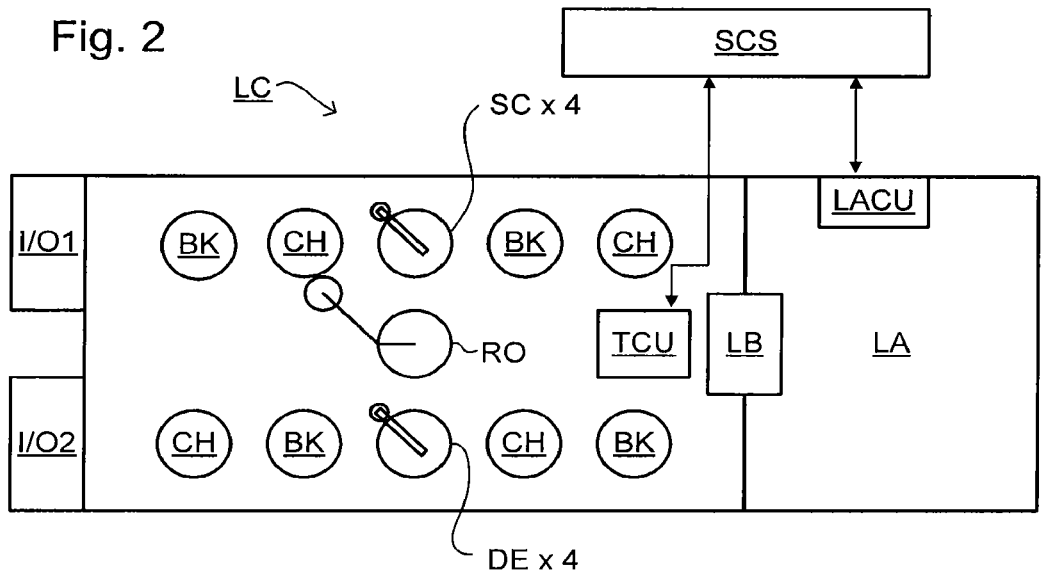
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
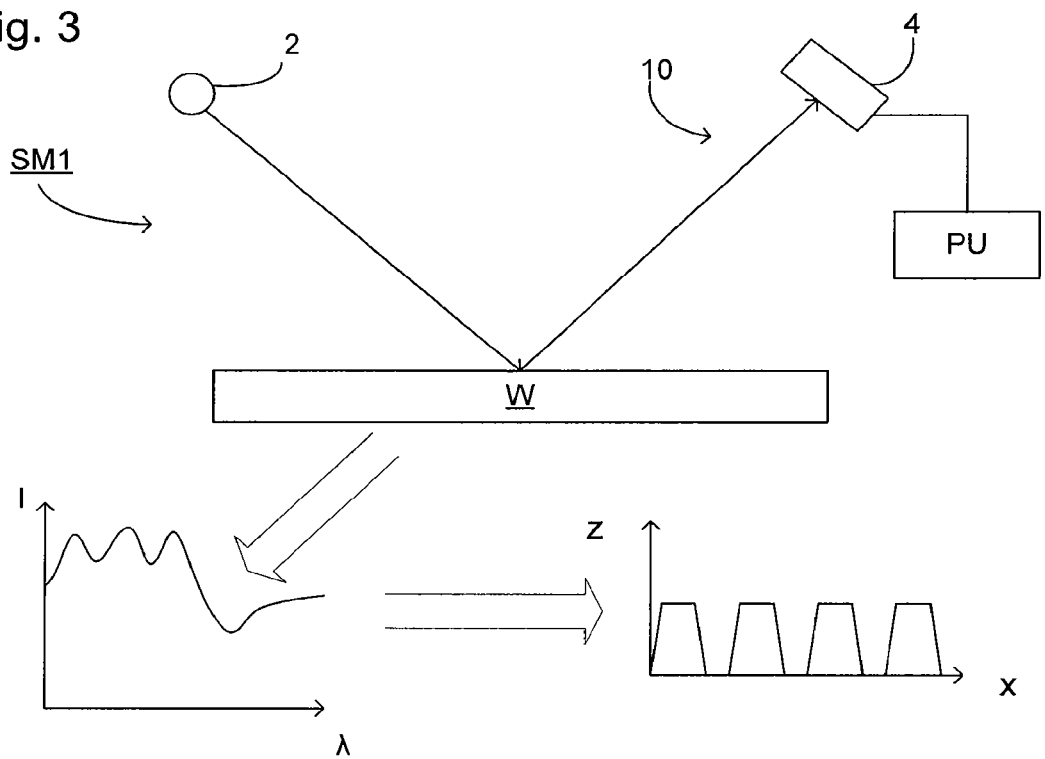
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
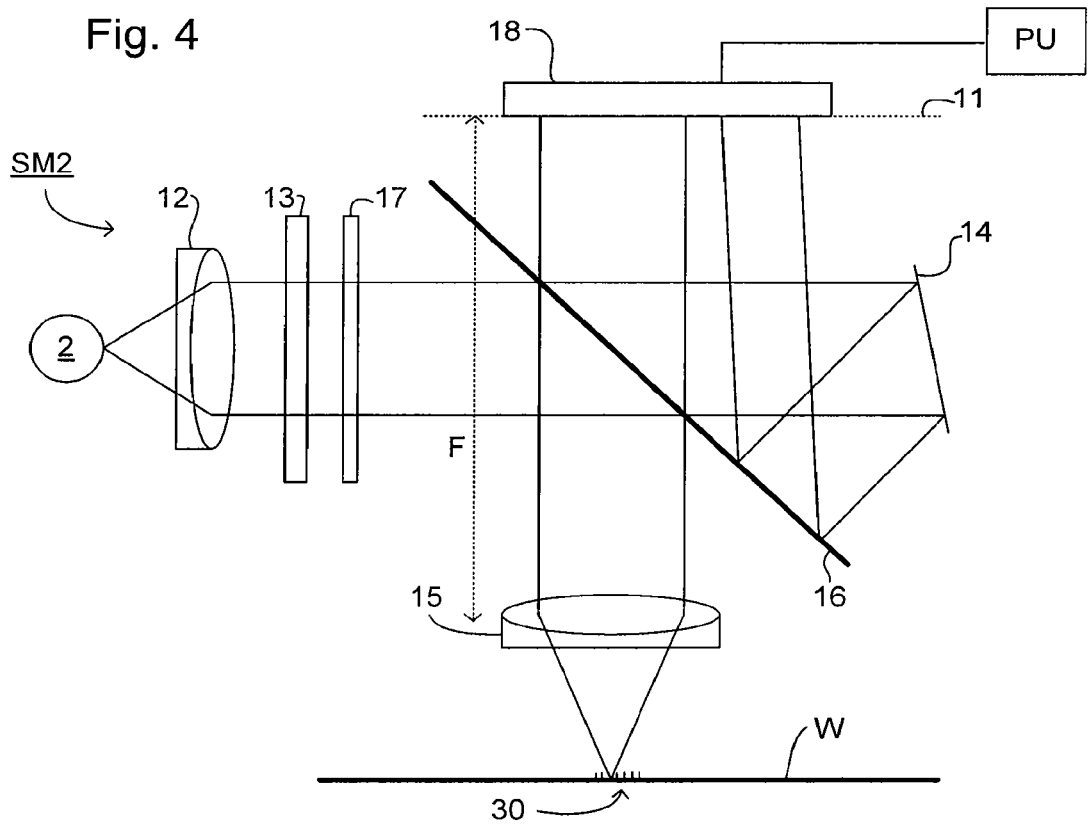
FIG. 4 depicts a second scatterometer.

Another scatterometer that may be used with the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits though partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least $2\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 5:
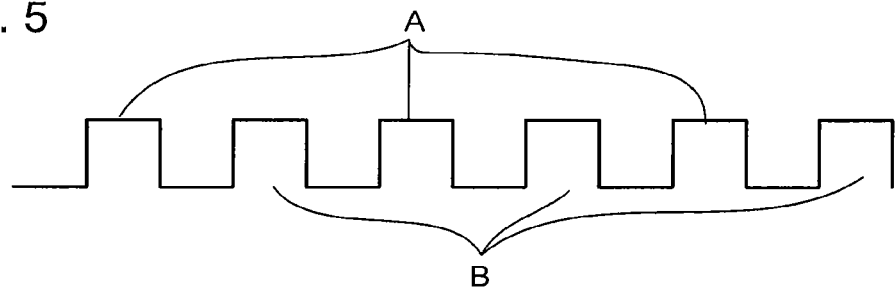
FIG. 5 depicts a pattern exposed using a double patterning technique.
Figure 6:
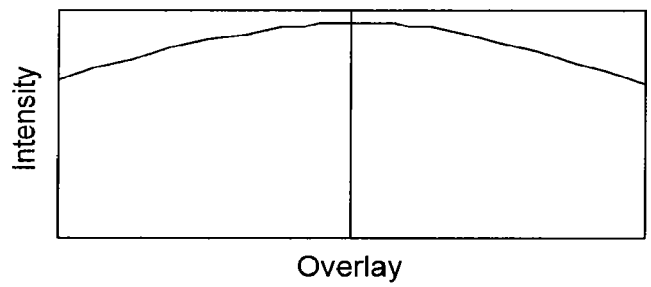
FIG. 6 is a graph depicting how the intensity of the zeroth order diffraction pattern varies with the overlay error.

In order to distinguish between the two populations used in double patterning it is necessary to introduce a difference, or asymmetry, between the two populations. A regular pattern in which the two populations are identical and form a regular pattern is shown in FIG. 5a. However, if there is a small overlay error between the second population and the first population it is difficult to detect because the zeroth order diffraction pattern (used in most scatterometry applications) does not change substantially. The variation in intensity of the zeroth diffraction order pattern with overlay error OV is shown in FIG. 6. As can be seen from FIG. 6 the change in the diffraction pattern for a given change in overlay error for a small overlay error is small (i.e., the gradient around the zero overlay error is negligible). However, for the same given change in overlay error for a large overlay error there is a large change in the diffraction pattern. Similarly, if the user wishes to assess other profile parameters such as, for example, the critical dimension or the side wall angle of one of the populations it is difficult to distinguish between the two populations to assess the critical dimension or side wall angle of them.

Figure 7A:
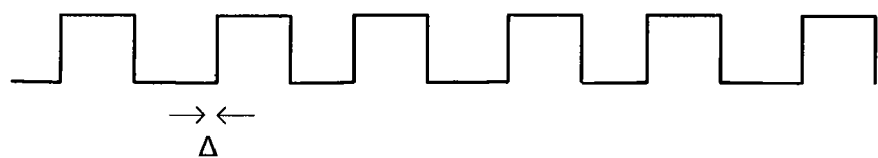
FIG. 7a depicts a pattern in which there is an overlay error between the first and second populations.
Figure 7B:
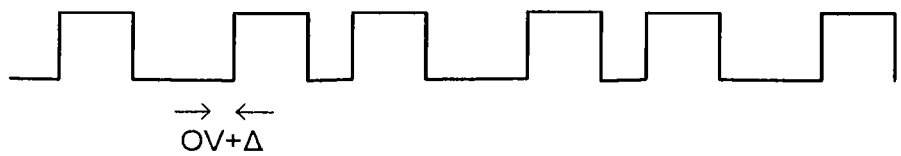
FIG. 7b depicts a target population in which there is a bias and an overlay error between the first and second target populations.

FIG. 7 depicts a method of determining characteristics. FIG. 7a depicts the main pattern in which there is a single pattern made up of a first population, A, and a second population, B. However, there is a small overlay error, OV, in the placement of the second population. FIG. 7b depicts a target used in the first embodiment of the invention. A first target population has been formed and a second target population then formed. The second target population has a bias, Δ with respect to the first target population. Thus, the deviation in placement of the second target population with respect to the first target population is equal to the bias, Δ, plus the overlay error OV. It is this introduced asymmetry which means that it is much easier to determine the overlay error. The zeroth order diffraction pattern is detected and the deviation from the expected diffraction pattern used to determine the overlay error. Alternatively, it is easier to distinguish between the two populations and thus measure characteristics of the two populations such as the critical dimension or the side wall angle.

FIG. 8 shows a first target 31 exposed according to an embodiment of the invention. FIG. 8a depicts part of a first population A which forms part of a first target. FIG. 8b depicts part of a second population B which is superimposed over the first population and also forms part of a first target, the cross section of which is shown in FIG. 8c. As can be seen, the second population B has a larger critical dimension than the first population A. Introducing an asymmetry between the two populations again makes it easier to distinguish between the two populations and thus assess characteristics of each of the populations and the overlay error. The zeroth order diffraction pattern is detected and the deviation from the expected diffraction pattern used to determine the critical dimension of one of the populations or the overlay error. The same diffraction pattern may also be used to determine the critical dimension of the other population.

However, it can be difficult to obtain information about both the features and the spaces between the features from a single target. According to the invention there are a plurality of targets (each comprising a second population superimposed on a first population), each with a different asymmetry. Different targets can then be used to determine different characteristics of the populations. According to an embodiment of the invention depicted in FIG. 9 there are two targets, 31, 32 each comprising a second population superimposed on a first population. FIG. 10 depicts a detail of the second target. FIG. 10a depicts the first population of the second target and FIG. 10b depicts the second population of the second target in which the spaces between the features differ. This results in a target as shown in FIG. 10c. The diffraction pattern from the second target is detected and the width of the spaces detected. Introducing an asymmetry which relates specifically to the spaces, rather than the features makes it easier to detect features of the spaces. Thus the invention preferably has one target with an asymmetry relating to the spaces between features and one target with an asymmetry relating to the features themselves.

Other types of asymmetries can also be introduced into the populations. As described above a bias can be introduced into the one of the populations in one of the targets. The bias may be any value but should be less than the period of the pattern. For example, for a pattern having a period of 16 nm a bias of 5-10 nm is preferred. FIG. 11 depicts a target in which every third line of the second population is missing. Again, this introduces an asymmetry which makes it easier to distinguish between the two populations.

Although the first embodiment described above has been described using two populations, i.e., manufactured using a LELE or LFLE process, it is equally applicable to a spacer method of double patterning. FIG. 12a depicts the spacer method of double patterning in which a spacer, 21, is used to generate spaces between the resist 22 and thus generate a regular pattern. FIG. 12b depicts the situation when the spacer 21 is too small and thus there is an overlay error OV between adjacent features or any parameter of either population. A known bias would be introduced by deliberately modifying the size of the spacer and any characteristics of the features, such as those introduced by an error in the size of the spacer, assessed.

As discussed above, this invention relates to the introduction of asymmetry into a target population. Specific examples of asymmetry such as missing lines, a bias and a variation in critical dimension have been outlined above although any method of introducing an asymmetry would be suitable. Further examples of asymmetries between the two populations would be the second population being a different height from the first population or a different side wall angle. Alternatively, different materials could be used for the different populations. Furthermore, the invention is not limited to the use of just two populations and could equally well be applied when there are three or more populations.

Additional targets comprising the first population and second population and having an asymmetry (which may be the same or different from the asymmetries in the first two targets) may also be used.

Alternatively additional targets may be used in which only either the first or the second population is formed. This allows the characteristics of each population to be analyzed separately. A target combining both populations is then used to analyze the overlay error.

The invention has been described in conjunction with the use of a single asymmetry for each target. However, two or more asymmetries could be introduced to a single target. For example, the side wall angle and the critical dimension of one of the populations in a target could be varied. This will again make it easier to distinguish between the different populations and thus measure the overlay error and characteristics of each population.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of determining a characteristic of features on a substrate, the method comprising:
    forming a first population of a first target and a first population of a second target on a single layer of the substrate, the first population of the first target being distinct from the first population of the second target;
    forming a second population of the first target and a second population of the second target on the single layer of the substrate, the second population of the first target being distinct from the second population of the second target;
    detecting radiation reflected from the first target;
    calculating a first characteristic of either the first population or the second population of the first target using radiation reflected from the first target;
    detecting radiation reflected from the second target; and
    calculating a second characteristic of either the first population or the second population of the second target using radiation reflected from the second target;
    wherein the first population of the first target has a first asymmetry with respect to the second population of the first target and the first population of the second target has a second asymmetry with respect to the second population of the second target, the first asymmetry comprising a difference in the spacing between the features of the first and second populations of the first target, and the second asymmetry comprising a difference in a critical dimension of the features of the first and second populations of the second target.

2. The method of claim 1, wherein the second asymmetry further comprises a difference in the spacing between the features of the first and second populations of the second target.

3. The method of claim 1, wherein the first characteristic is the space between a first feature and a second feature of the first target, and wherein the second characteristic is the space between a first feature and a second feature of the second target.

4. The method of claim 1, wherein the first asymmetry further comprises a difference in a critical dimension of the features of the first and second populations of the first target.

5. The method of claim 1, wherein the first asymmetry further comprises either the first population or the second population of the first target having each nth feature removed, and wherein the second asymmetry further comprises either the first population or the second population of the second target having each nth feature removed, n being a finite number greater than 1.

6. The method of claim 1, wherein the first characteristic is a critical dimension of a feature of either the first or second population of the first target, and wherein the second characteristic is a critical dimension of a feature of either the first or second population of the second target.

7. The method of claim 1, wherein the first characteristic is an error in the placement of the second population of the first target, and wherein the second characteristic is an error in the placement of the second population of the second target.

8. The method of claim 1, wherein the first characteristic is a side wall angle of either the first population or the second population of the first target, and wherein the second characteristic is a side wall angle of either the first population or the second population of the second target.

9. The method of claim 1, wherein the first asymmetry further comprises a feature of the second population of the first target having a different height, width, size, value or proportion from a feature of the first population of the first target, and wherein the second asymmetry further comprises a feature of the second population of the second target having a different height, width, size, value or proportion from a feature of the first population of the second target.

10. The method of claim 1, wherein forming the first population of the first and second targets comprises exposing the substrate and processing the substrate, and forming the second population of the first and second targets comprises a second exposing and a second processing of the substrate.

11. The method of claim 1, wherein forming the first population of the first and second targets comprises exposing and freezing the substrate, and forming the second population of the first and second targets comprises a second exposing and a second processing of the substrate.

12. The method of claim 1, wherein forming the first population of the first and second targets and forming the second population of the first and second targets occur simultaneously.

\* \* \* \* \*